United States Patent
Goto (10) Patent No.: US 6,848,310 B2
(45) Date of Patent: Feb. 1, 2005

(54) CAPACITIVE DYNAMIC QUANTITY SENSOR, METHOD FOR MANUFACTURING CAPACITIVE DYNAMIC QUANTITY SENSOR, AND DETECTOR INCLUDING CAPACITIVE DYNAMIC QUANTITY SENSOR

(75) Inventor: Keisuke Goto, Obu (JP)

(73) Assignee: Denso Corporation, Kariya (JP)

( * ) Notice: Subject to any disclaimer, the term of this patent is extended or adjusted under 35 U.S.C. 154(b) by 51 days.

(21) Appl. No.: 10/614,835

(22) Filed: Jul. 9, 2003

(65) Prior Publication Data

US 2004/0017209 A1 Jan. 29, 2004

(30) Foreign Application Priority Data

Jul. 26, 2002 (JP) .......................... 2002-218613

(51) Int. Cl.[7] .................. H01G 7/00; G01P 15/125; G01P 15/00
(52) U.S. Cl. ................... 73/514.32; 73/514.38; 361/283.3
(58) Field of Search ................ 73/504.12, 504.14, 73/514.18, 514.38, 514.32; 361/280, 283.1, 283.3

(56) References Cited

U.S. PATENT DOCUMENTS 6,276,207 B1  8/2001  Sakai et al. ............... 73/514.16

2001/0029060 A1 * 10/2001  Fukada et al. ............... 438/50

FOREIGN PATENT DOCUMENTS

JP    A-H06-160419    6/1994
JP    A-2000-40830    2/2000

* cited by examiner

Primary Examiner—Hezron Williams
Assistant Examiner—Tamiko Bellamy
(74) Attorney, Agent, or Firm—Posz & Bethards, PLC

(57) ABSTRACT

A capacitive dynamic quantity sensor includes a semiconductor substrate, a weight, a movable electrode, and two fixed electrodes. The weight is movably supported by the semiconductor substrate. The movable electrode is integrated with the weight. The fixed electrodes are stationarily supported by the semiconductor substrate. The fixed electrodes face the movable electrode to provide a narrow gap and a wide gap and form a detection part having a capacitance. The weight and the movable electrode are displaced relative to the fixed electrodes in response to a dynamic quantity to be detected such that one of the gaps increases while the other decreases. The dynamic quantity is detected on the basis of the variation in the capacitance. One of wide gap electrode surfaces, which define the wide gap, is smaller than narrow gap electrode surfaces, which define the narrow gap, to improve sensor sensitivity.

6 Claims, 6 Drawing Sheets

CAPACITIVE DYNAMIC QUANTITY SENSOR, METHOD FOR MANUFACTURING CAPACITIVE DYNAMIC QUANTITY SENSOR, AND DETECTOR INCLUDING CAPACITIVE DYNAMIC QUANTITY SENSOR

CROSS REFERENCE TO RELATED APPLICATION

This application is based on and incorporates herein by reference Japanese Patent Application No. 2002-218613 filed on Jul. 26, 2002.

BACKGROUND OF THE INVENTION

The present invention relates to a capacitive dynamic quantity sensor, a method for manufacturing the capacitive dynamic quantity sensor, and a detector including the capacitive dynamic quantity sensor.

Figure 7A:
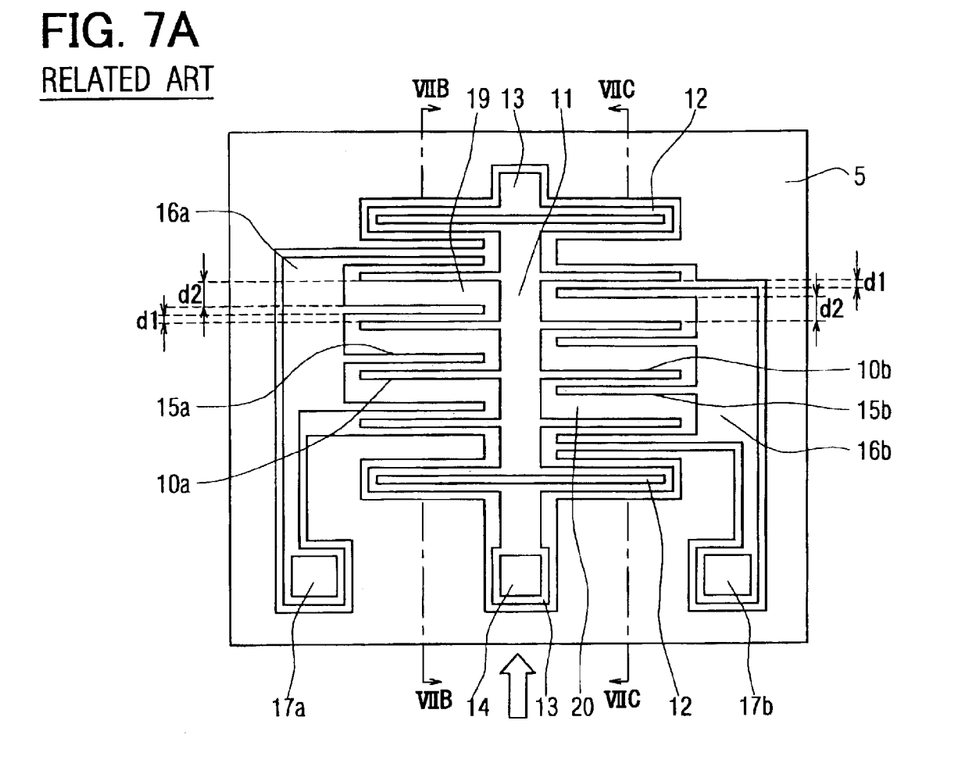
FIG. 7A is a schematic plan view of a proposed semiconductor acceleration sensor.
Figure 7B:
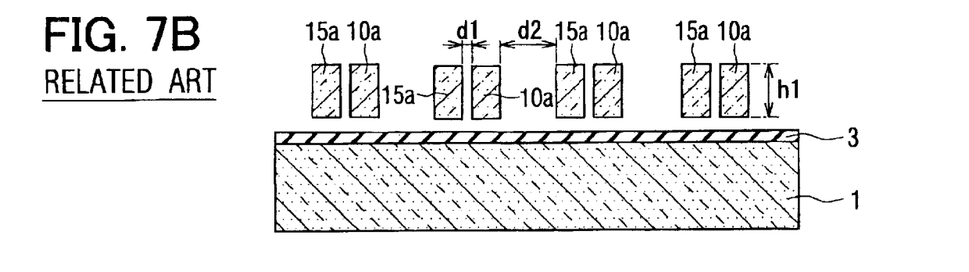
FIG. 7B is a schematic partial cross-sectional view of the sensor in FIG. 7A taken along the line VIIB—VIIB, showing the state that no acceleration is applied.

For example, a capacitive semiconductor acceleration sensor shown in FIG. 7A is such a capacitive dynamic quantity sensor. As shown in FIGS. 7A and 7B, in the acceleration sensor, a weight 11 is supported by anchors 13, which are fixed to a semiconductor substrate 1, through springs 12. First and second comb-tooth-like movable electrodes 10a, 10b are integrated with the weight 11. As illustrated in FIG. 7A, first and second comb-tooth-like fixed electrodes 15a, 15b, which respectively face the first and second movable electrodes 10a, 10b, are supported at one ends thereof by first and second electrode wiring lines 16a, 16b.

When acceleration is detected, predetermined voltages are applied between movable electrode pad 14 for the movable electrodes 10a, 10b and fixed electrode pads 17a, 17b for the fixed electrodes 15a, 15b. With the voltages, first and second capacitances CS1 and C2 are formed respectively between the first movable electrodes 10a and the first fixed electrodes 15a and between the second movable electrodes 10b and the second fixed electrodes 15b. CS1 and CS2 are expressed by the following equation eq. 1 when no acceleration is applied, $$CS1 = CS2 = \in \times n \times L \times h1 \times (1/d1 + 1/d2) \qquad \text{eq. 1}$$

where $\in$ is dielectric constant, n is the number of each group of the movable electrodes, L is the effective electrode length, which is the length of the surfaces at which the movable and fixed electrodes face, h1 is the electrode height, which is the height of the surfaces at which the movable and fixed electrodes face, and d1 and d2 are respectively the dimension of the narrow gaps between the electrodes and the dimension of the wide gaps between the electrodes. In the acceleration sensor shown in FIG. 7A, each of the electrodes has the same effective electrode length L and the same electrode height h1.

When the sensor is accelerated, the springs 12 deform to vary the dimensions d1 and d2, or the distances d1 and d2 between the movable electrodes 10a, 10b and the fixed electrodes 15a, 15b. However, the dimension d2 of the wide gaps is sufficiently greater than the dimension d1 of the narrow gaps, so the first and second capacitances CS1 and CS2 vary with the distance variation. Therefore, the acceleration can be measured by detecting the capacitance difference $\Delta C$, or (CS1−CS2), between the first and second capacitances CS1 and CS2.

Figure 7C:
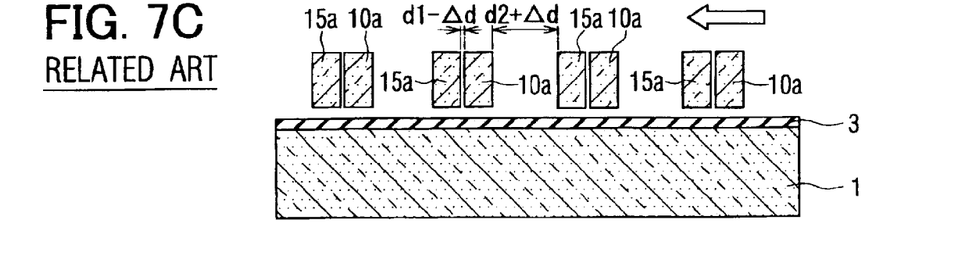
FIG. 7C is a schematic partial cross-sectional view of the sensor in FIG. 7A taken along the line VIIB—VIIB, showing the state that acceleration is applied.

Specifically, for example, if the sensor is accelerated to displace the first movable electrodes 10a by $\Delta d$ in the direction shown by arrows in FIGS. 7A and 7C, the dimension d1 of the narrow gaps narrow by $\Delta d$ and the wide gaps d2 widen by $\Delta d$ between the first movable electrodes 10a and the first fixed electrodes 15a to increase the first capacitance CS1, as shown in FIG. 7C. On the other hand, in the cross-section taken along the line VIIC—VIIC in FIG. 7A, the dimension d1 of the narrow gaps widens by $\Delta d$ and the dimension d2 of the wide gaps narrows by $\Delta d$ between the second movable electrodes 10b and the second fixed electrodes 15b to decrease the second capacitance CS2. As a result, the capacitance difference $\Delta C$ increases.

More specifically, when the sensor is accelerated to displace the first movable electrodes 10a by $\Delta d$ in the direction shown by arrows in FIGS. 7A and 7C, the narrow gaps become $(d1-\Delta d)$ and the wide gaps become $(d2+\Delta d)$ between the first movable electrodes 10a and the first fixed electrodes 15a. On the other hand, the narrow gaps become $(d1+\Delta d)$ and the wide gaps become $(d2-\Delta d)$ between the second movable electrodes 10b and the second fixed electrodes 15b. Therefore, from eq. 1, $\Delta C$, or (CS1−CS2), can be expressed by the following equation.

$$\Delta C = \in \times n \times L \times h1 \times [\{1/(d1-\Delta d)+1/(d2+\Delta d)\}-\{1/(d1+\Delta d)+1/(d2-\Delta d)\}] = \in \times n \times L \times h1 \times 2\Delta d \times \{1/(d1^2-\Delta d^2)-1/(d2^2-\Delta d^2)\}$$

Here, $\Delta d$ is sufficiently small in comparison with d1 and d2. Therefore, $\Delta C$ can be expressed by the following equation eq. 2.

$$\Delta C \approx \in \times n \times L \times h1 \times 2\Delta d \times (1/d1^2 - 1/d2^2) \qquad \text{eq. 2}$$

The sensor sensitivity can be improved by increasing the variation in capacitance per unit acceleration, that is, $\Delta C$ in eq. 2. As understood from eq. 2, $\Delta C$ can be increased by sufficiently increasing d2 in comparison with d1.

However, it is difficult to sufficiently improve the sensor sensitivity by adjusting the distances between the electrodes because the dimension d2 of the wide gaps is limited by the dimensions of the sensor.

SUMMARY OF THE INVENTION

The present invention has been made in view of the above aspects with an object to provide a capacitive dynamic quantity sensor having sensitivity higher than the proposed sensor, a method for manufacturing the capacitive dynamic quantity sensor, and a detector including the capacitive dynamic quantity sensor.

A capacitive dynamic quantity sensor according to the present invention includes a semiconductor substrate, a weight, a movable electrode, and two fixed electrodes. The weight is movably supported by the semiconductor substrate. The movable electrode is integrated with the weight. The fixed electrodes are stationarily supported by the semiconductor substrate. The fixed electrodes face the movable electrode to provide a narrow gap and a wide gap and form a detection part having a capacitance. The weight and the movable electrode are displaced relative to the fixed electrodes in response to a dynamic quantity to be detected such that one of the gaps increases while the other decreases. The dynamic quantity is detected on the basis of the variation in the capacitance. One of wide gap electrode surfaces, which define the wide gap, is smaller than narrow gap electrode surfaces, which define the narrow gap, to improve sensor sensitivity.

The above sensor can be incorporated into a detector with a detection circuit, which outputs a detection signal when the capacitance varies due to the dynamic quantity to be detected.

The above sensor can be manufactured by forming the movable electrode and the two fixed electrodes on the semiconductor substrate such that one of the wide gap electrode surfaces becomes smaller than the narrow gap electrode surfaces.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

The present invention will be described in detail with reference to various embodiments.

First Embodiment

Figure 1A:
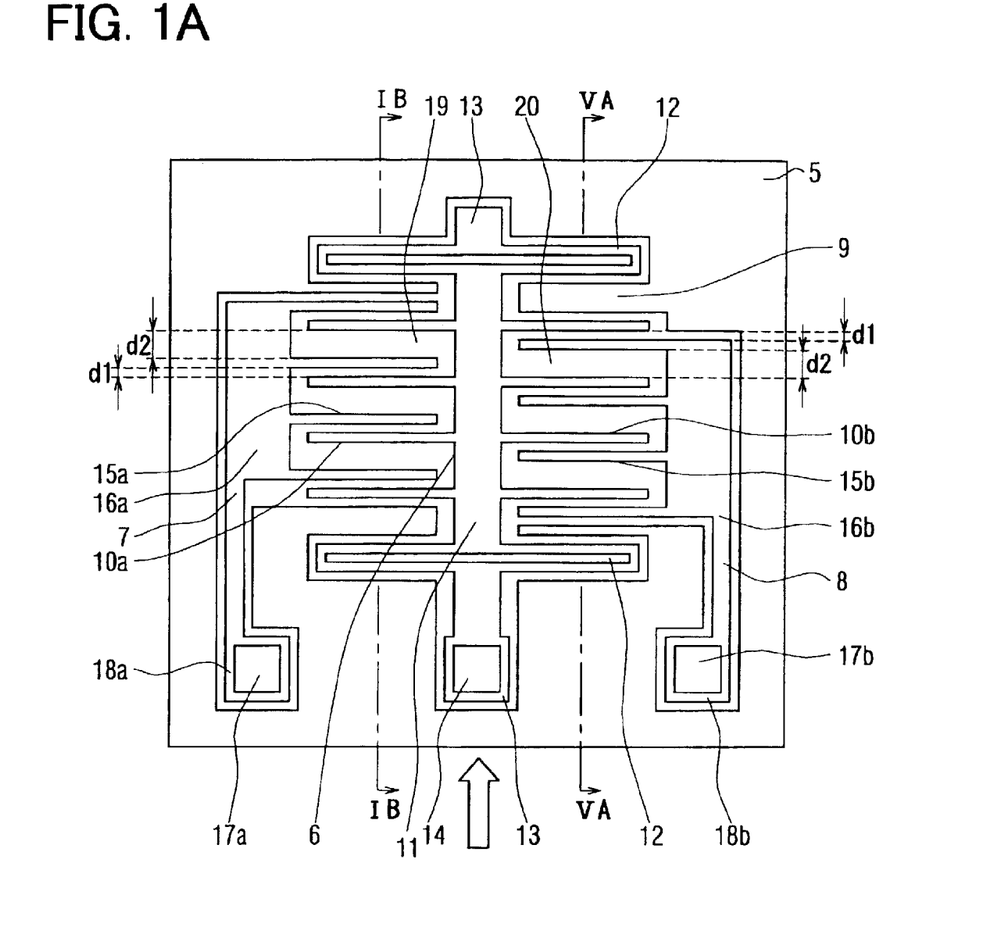
FIG. 1A is a schematic plan view of a capacitive semiconductor acceleration sensor according to a first embodiment of the present invention.
Figure 1B:
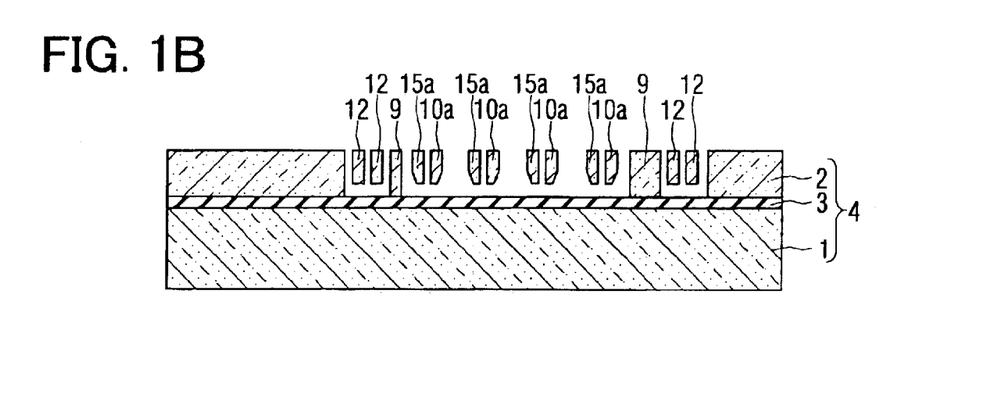
FIG. 1B is a schematic cross-sectional view of the sensor in FIG. 1A taken along the line IB—IB.

As shown in FIGS. 1A and 1B, a semiconductor acceleration sensor according to a first embodiment includes a substrate 4, which has a Silicon-On-Insulator (SOI) structure. The substrate 4 is composed of a semiconductor substrate 1, or a first semiconductor layer 1, a second semiconductor layer 2, and an insulating layer 3, which is a sacrificial layer made of, for example, silicon oxide. The semiconductor layers 1, 2 are made of single crystal silicon. The sensor of FIGS. 1A and 1B includes a sensing portion 5, which has been formed by well-known micromachining technology using semiconductor process technology.

As shown in FIG. 1A, the sensing portion 5 includes a movable unit 6, first and second fixed units 7, 8, and peripheral portion 9, which surrounds the movable unit 6 and the fixed units 7, 8. There are predetermined clearances between the movable unit 6, the fixed units 7, 8, and the peripheral portion 9 to insulate them from one another.

The movable unit 6 includes four first comb-tooth-shaped movable electrodes 10a, four second comb-tooth-shaped movable electrodes 10b, a weight 11, two rectangular frame-shaped springs 12, two movable electrode anchors 13, and a movable electrode pad 14. The springs 12 are joined to the weight 11, which is a mass portion on which acceleration acts, and the movable electrode anchors 13, which are connected to the insulating layer 3. The movable electrodes 10a, 10b are integrated with the weight 11 to extend from two sides of the eight 11 orthogonally to the longitudinal direction of the weight 11. The movable electrodes 10a, 10b, the weight 11, and the springs 12 are spaced apart form the insulating layer 3. The structure is formed by etching the second semiconductor layer 2 from its surface and consecutively selectively etching the sidewalls of the second semiconductor layer 2 in the proximity of the surface of the insulating layer 3 using selective plasma etching.

Each of the springs 12 functions as a spring to expand and shrink along the directions orthogonal to the longitudinal direction thereof. Therefore, the weight 11 and the movable electrodes 10a, 10b move in the direction shown by the arrow in FIG. 1A when the sensor is accelerated in that direction and moves back to the original position when the acceleration becomes zero. The movable electrode pad 14 is connected to one of the movable electrode anchors 13 at a predetermined position. The movable electrode pad 14 is used for electrically connecting the movable electrodes 10a, 10b to a C-V converter circuit, which is described later.

The first and second fixed units 7, 8 respectively include: four comb-tooth-shaped first fixed electrodes 15a and four comb-tooth-shaped second fixed electrodes 15b; first and second fixed electrode wiring lines 16a, 16b; first and second fixed electrode anchors 18a, 18b; and first and second fixed electrode pads 17a, 17b. The first and second fixed electrode pads 17a, 17b are respectively located on the first and second fixed electrode anchors 18a, 18b for electrically connecting the fixed electrodes 15a, 15b to the C-V converter circuit. The fixed electrode wiring lines 16a, 16b are arranged to be parallel to the longitudinal directions of the weight 11. The first and second fixed electrodes 15a, 15b respectively extend from the first and second fixed electrode wiring lines 16a, 16b to face respectively parallel the first and second movable electrodes 10a, 10b, which extend from the two side of the weight 11, such that a predetermined detection gap is formed between the fixed electrodes 15a, 15b and the movable electrodes 10a, 10b.

The fixed electrode wiring lines 16a, 16b and the fixed electrode anchors 18a, 18b are fixed to the semiconductor substrate 1 with the insulating layer 3 therebetween. The first and second fixed electrodes 15a, 15b are supported at one ends thereof by the first and second fixed electrode wiring lines 16a, 16b. The first movable electrodes 10a and the first fixed electrodes 15a form a first detection part 19 that provides a first capacitance C1, and the second movable electrodes 10b and the second fixed electrodes 15b form a second detection part 20 that provides a second capacitance CS2.

As shown in FIG. 1A, the first movable electrodes 10a and the first fixed electrodes 15a interleave with each other such that narrow gaps having a dimension of d1 and wide gaps having a dimension of d2 are alternately arranged between the first movable electrodes 10a and the first fixed electrodes 15a when no acceleration is applied. In the same manner, the second movable electrodes 10b and the second fixed electrodes 15b interleave with each other such that narrow gaps having a dimension of d1 and wide gaps having a dimension of d2 are alternately arranged between the second movable electrodes 10b and the second fixed electrodes 15b.

As shown in FIG. 1A, the positional relation between the first movable electrodes 10a and the first fixed electrodes 15a is different from that between the second movable electrodes 10b and the second fixed electrodes 15b. More specifically, as illustrated in FIG. 1A, the narrow gaps of the first detection part 19 and the narrow gaps of the second detection part 20 are on the opposite sides of the axes that are defined by each of the first movable electrodes 10a and the corresponding second movable electrode 10b. Therefore, for example, if the sensor is accelerated to displace the movable electrodes 10a, 10b in the direction shown by the arrow in FIG. 1A, the dimension d1 of the narrow gaps in the first detection part 19 decreases, and the dimension d2 of the wide gaps in the first detection part increases. On the other hand, the dimension d1 of the narrow gaps in the second detection part 20 increases, and the dimension d2 of the wide gaps in the second detection part decreases.

Figure 2A:
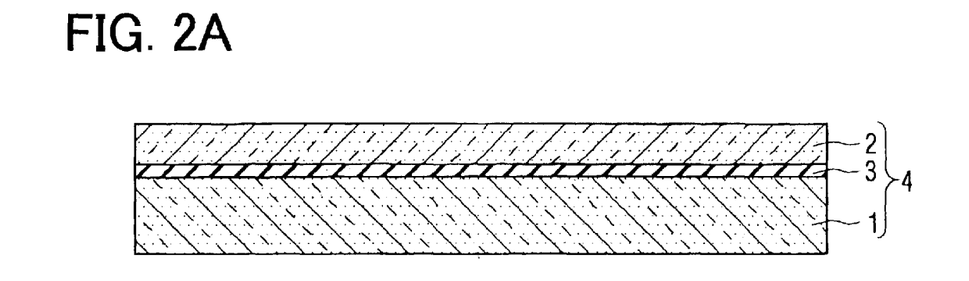
FIGS. 2A to 2C are schematic cross-sectional views at the cross-section corresponding to that shown in FIG. 1B, showing a method for manufacturing the sensor of FIG. 1A.

Next, a method for manufacturing the semiconductor acceleration sensor of FIGS. 1A and 1B will be briefly explained. First, an SOI substrate 4 is prepared, as shown in FIG. 2A. The substrate 4 is composed of a semiconductor substrate 1, or a first semiconductor layer 1, a second semiconductor layer 2, and an insulating layer 3, which is made of silicon oxide and located between the first and second semiconductor layers 1, 2. The semiconductor layers 1, 2 are made of single crystal silicon. Although a plurality of sensors can be formed from an SOI substrate 4, the explanation will be made on only one sensor.

Then, although not shown in the figure, a movable electrode pad 14 and first and second fixed electrode pads 17a, 17b are formed on the second semiconductor layer 2. The pads 14, 17a, 17b can be formed, for example, by: depositing a highly conductive metal on the entire surface of the second semiconductor layer 2 by a predetermined thickness; and patterning into predetermined shapes using photolithography and etching. Metals such as copper (Cu), aluminum (Al), gold (Au), and silver (Ag) may be used for the pads 14, 17a, 17b.

Figure 2B:
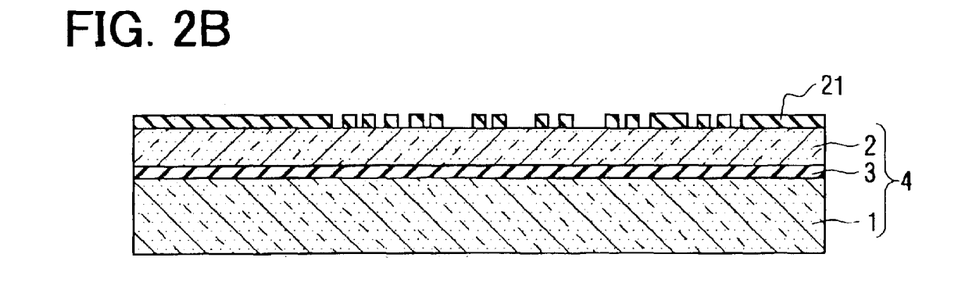

Then, as shown in FIG. 2B, an etching mask 21 is formed for forming movable and fixed electrodes 10a, 10b, 15a, 15b. Specifically, an etching mask 21 that has openings at the positions where the gaps between the electrodes 10a, 10b, 15a, 15b are to be formed is formed in a predetermined area on the second semiconductor layer 2 by photolithography and etching. For example, a silicon nitride film, a silicon oxide film, a metal film, and a photoresist film may be used as the etching mask 21.

Figure 2C:
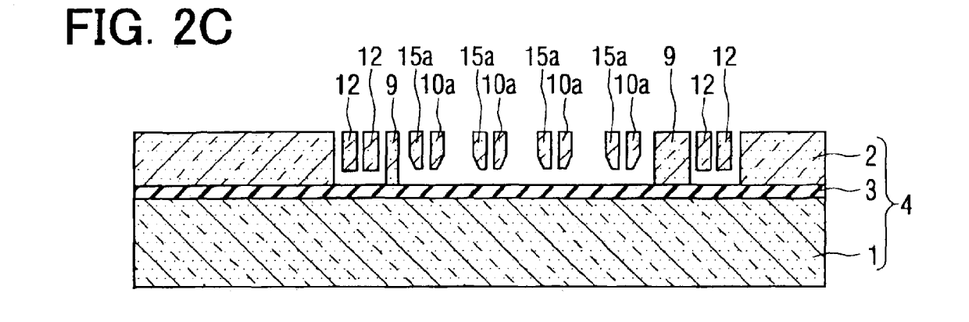

After the etching mask 21 is formed, the second semiconductor layer 2 is selectively etched by, for example, plasma etching through the openings of the etching mask 21, as shown in FIG. 2C. With the etching, the second semiconductor layer 2 is partially removed below the openings to expose the insulating layer 3. At the same time, the second semiconductor layer 2 is also removed at the portions located below the electrodes 10a, 10b, 15a, 15b. With the etching, a movable unit 6 is formed, and the movable electrodes 10a, 10b, the weight 11, and the springs 12 of the movable unit 6 become movable. In the above etching, the wide gap electrode surfaces, or the surfaces of the electrodes 10a, 10b, 15a, 15b that define wide gaps, are machined such that the electrode surfaces become smaller than the small gap electrode surfaces, or the surfaces of the electrodes 10a, 10b, 15a, 15b that define small gaps.

Then, the etching mask 21 is removed, and the SOI substrate 4 diced into a plurality of sensor chips to complete the semiconductor acceleration sensor of FIGS. 1A and 1B.

In the above explanation, although only the cross-section taken along line IB—IB of FIG. 1A was used, the portion shown by the cross-section taken along the line VA—VA of FIG. 1A is formed in the same manner.

Figure 3:
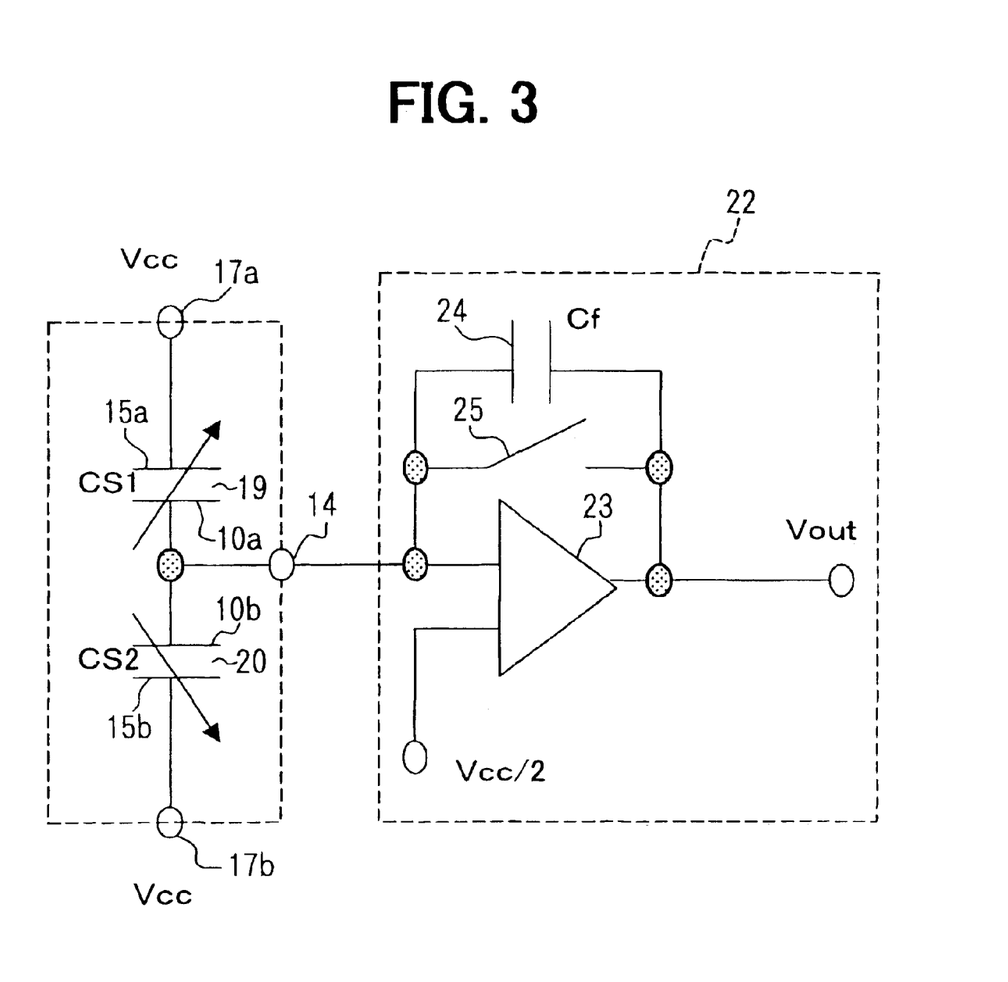
FIG. 3 is an equivalent circuit diagram for a detection circuit for the sensor of FIG. 1A.

FIG. 3 is an equivalent circuit diagram for a detection circuit for the sensor of FIG. 1A, which is included in a detector having a sensor of FIG. 1A. As shown in FIG. 3, the detection circuit includes a C-V converter circuit 22, or a switched capacitor circuit 22. The C-V converter circuit 22 converts the capacitance difference (CS1–CS2) between the first and second capacitances CS1 and CS2 into voltage difference and outputs the voltage difference. The C-V converter circuit 22 includes an operational amplifier 23, a capacitor 24 having a capacitance Cf, and a switch 25.

The inverting input terminal of the operational amplifier 23 is electrically connected to the movable electrodes 10a, 10b through the movable electrode pad 14. The capacitor 24 and the switch 25 are connected in parallel between the inverting input terminal and the output terminal of the operational amplifier 23. A voltage of Vcc/2 is applied from a power source, which is not illustrated in the figure, to the non-inverting input terminal of the operational amplifier 23.

The detection circuit also includes a control circuit, which is not illustrated in the figure. The control circuit inputs a first carrier wave, which has a constant amplitude of Vcc and alternates periodically, from the first fixed electrode pad 17a to the first fixed electrodes 15a of the first detection part 19. At the same time, the control circuit inputs a second carrier wave, which has a constant amplitude of Vcc, the phase of which is shifted by 180° from the first carrier wave, from the second fixed electrode pad 17b to the second fixed electrodes 15b of the second detection part 20.

Therefore, when no acceleration is applied, each potential of the detection parts 19, 20 becomes Vcc/2 because the first capacitance CS1 of the first detection part 19 is substantially equal to the second capacitance CS2 of the second detection part 20. The switch 25 in the C-V converter circuit 22 is turned on and off with predetermined timing that is synchronized with the carrier waves. When the switch 25 is off, acceleration is detected. The C-V converter circuit 22 outputs a voltage of Vout in response to the acceleration. Vout is expressed by the following equation eq. 3.

$$Vout = (CS1 - CS2) \times Vcc / Cf \qquad \text{eq. 3}$$

When the sensor is accelerated, the ratio of the first capacitance CS1 to the second capacitance CS2 varies and Vout, which is proportionate to the capacitive difference (CS1–CS2) as understood by eq. 3, is outputted. The outputted voltage is processed by an amplification circuit or low-pass filter, which is not illustrated in the figure, and detected as an acceleration detection signal.

Although a voltage of Vcc/2 is applied from a power source, which is not illustrated in the figure, to the non-inverting input terminal of the operational amplifier 23, a voltage of V1, which is not equal to Vcc/2, may be provided in order to create a self-diagnosis function, in which the movable electrode 10a, 10b are forcedly displaced by switching Vcc/2 to V1 using a switch, which is not illustrated in the figure, with predetermined timing that is synchronized with the carrier waves.

As shown in FIGS. 7A and 7B, the proposed acceleration sensor includes a first detection part 19, which is made up of the first movable electrodes 10a and the first fixed electrodes 15a, and a second detection part 20, which is made up of the second movable electrodes 10b and the second fixed electrodes 15b. The first movable electrodes 10a and the first fixed electrodes 15a interleave with each other such that narrow gaps having a dimension of d1 and wide gaps having a dimension of d2 are alternately arranged between the first movable electrodes 10a and the first fixed electrodes 15a. In the same manner, the second movable electrodes 10b and the second fixed electrodes 15b interleave with each other such that narrow gaps having a dimension of d1 and wide gaps having a dimension of d2 are alternately arranged between the second movable electrodes 10b and the second fixed electrodes 15b.

In the proposed sensor of FIGS. 7A and 7B, if each of the electrodes has the same effective electrode length L, which is the length of the surfaces at which the movable and fixed electrodes face, and the same electrode height h1, which is the height of the surfaces at which the movable and fixed electrodes face, the first and second capacitances CS1 and CS2, which are formed respectively between the first movable electrodes 10a and the first fixed electrodes 15a and between the second movable electrodes 10b and the second fixed electrodes 15b, are expressed by the following equation eq. 4, $$CS1=CS2=\in \times n \times L \times h1 \times (1/d1+1/d2) \qquad \text{eq. 4}$$

where $\in$ is dielectric constant and n is the number of each group of the movable electrodes. When no acceleration is applied, the capacitance difference $\Delta C$, or (CS1−CS2), between the first and second capacitances CS1 and CS2 is zero.

When the proposed sensor is accelerated, the springs 12 deform to vary the dimensions d1 and d2. If the proposed sensor is accelerated to displace the first movable electrodes 10a by $\Delta d$ in the direction shown by arrows in FIGS. 7A and 7C, the narrow gaps become (d1−$\Delta d$) and the wide gaps become (d2−$\Delta d$) in the first detection part 19 to increase the first capacitance CS1. On the other hand, the narrow gaps become (d1+$\Delta d$) and the wide gaps become (d2−$\Delta d$) in the second detection part 20 to decrease the second capacitance CS2. As a result, the capacitance difference $\Delta C0$ increases.

From eq. 4, $\Delta C$ can be expressed by the following equation.

$$\Delta C0=\in \times n \times L \times h1 \times [\{1/(d1-\Delta d)+1/(d2+\Delta d)\}-\{1/(d1+\Delta d)+1/(d2-\Delta d)\}]=\in \times n \times L \times h1 \times 2\Delta d \times \{1/(d1^2-\Delta d^2)-1/(d2^2-\Delta d^2)\}$$

Here, $\Delta d$ is sufficiently small in comparison with d1 and d2. Therefore, $\Delta C0$ can be expressed by the following equation eq. 5.

$$\Delta C0 \approx \in \times n \times L \times h1 \times 2\Delta d \times (1/d1^2-1/d2^2) \qquad \text{eq. 5}$$

Therefore, the sensor sensitivity, that is, $\Delta C$ in eq. 5, can be increased by increasing the value in the parenthesis of eq. 5. The value in the parenthesis of eq. 5 can be increased by sufficiently increasing d2 in comparison with d1. However, it is difficult to sufficiently increase the dimension d2 of the wide gaps because the dimension d2 is limited by the dimensions of the sensor.

Here, the capacitance formed between a pair of electrodes is proportionate to the area of the electrodes and inversely proportionate to the distance between the electrodes. Therefore, it is possible to increase the variations of the capacitances CS1 and CS2 without increasing the dimension d2 of the wide gaps by decreasing the total area of the electrode surfaces that define the wide gaps in comparison with that defining the narrow gaps. The total area is the sum of the product of the effective electrode length L and the electrode height h1, that is, (n×L×h1).

Therefore, when the effective electrode length L is constant, it is possible to increase the variations of the capacitances CS1 and CS2 by decreasing the electrode height h1 of the electrode surfaces that define the wide gaps. As a result, the sensor sensitivity can be improved by increasing the variations of the capacitances CS1 and CS2, which correspond to the movement of the movable unit 6, in the detection parts 19, 20 and acquiring the signal that correspond to the difference between the capacitances CS1 and CS2, which vary in the opposite direction, using the C-V converter circuit 22.

As described above, in this embodiment, the sensor sensitivity can be improved by differentiating the electrode height h1 of the electrode surfaces that define the narrow gaps and the electrode height h2 of the electrode surfaces that define the wide gaps.

Figure 4A:
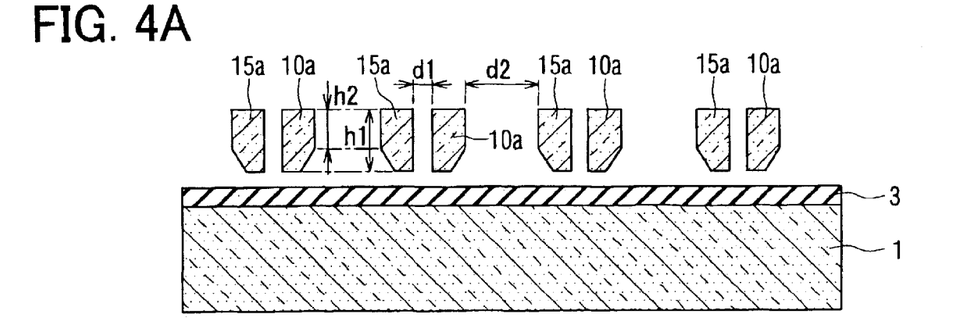
FIG. 4A is a partial schematic cross-sectional view of the sensor in FIG. 1A taken along the line IB—IB, showing the state that the sensor is not accelerated.
Figure 5A:
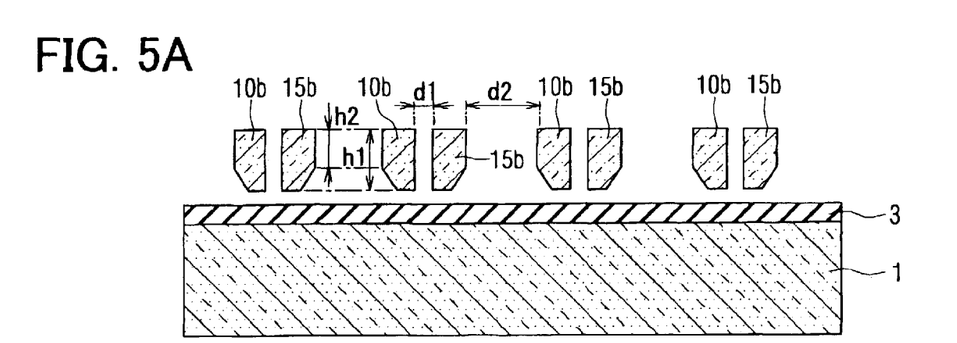
FIG. 5A is a partial schematic cross-sectional view of the sensor in FIG. 1A taken along the line VA—VA, showing the state that the sensor is not accelerated.

As shown in FIGS. 4A and 5A, when the electrode surfaces that define the wide gaps between the electrodes 10a, 15a of the first detection part 19 and those between the electrodes 10b, 15b of the second detection part 19 have an electrode height of h2, the first and second capacitances CS1 and CS2 of the first and second detection parts 19, 20 are expressed by the following equation eq. 6.

$$CS1=CS2=\text{Å} \times n \times L \times h1 \times (h1/d1+h2/d2) \qquad \text{eq. 6}$$

In this embodiment, the two electrode surfaces that define each of the wide gaps have an electrode height of h2. However, substantially the same effect can be acquired even if only one of the two electrode surfaces has an electrode height of h2.

Figure 4B:
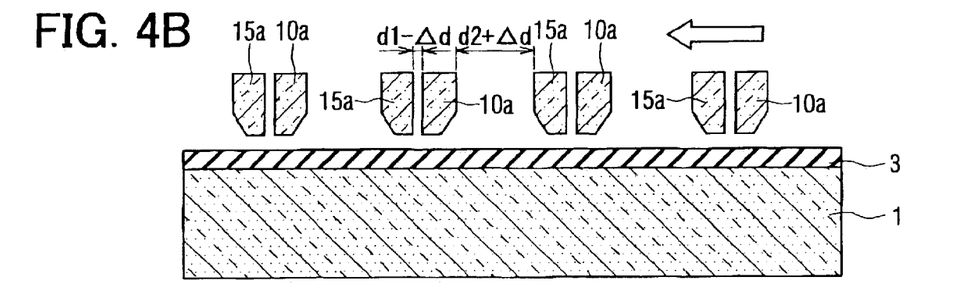
FIG. 4B is a partial schematic cross-sectional view of the sensor in FIG. 1A taken along the line IB—IB, showing the state that the sensor is accelerated.
Figure 5B:
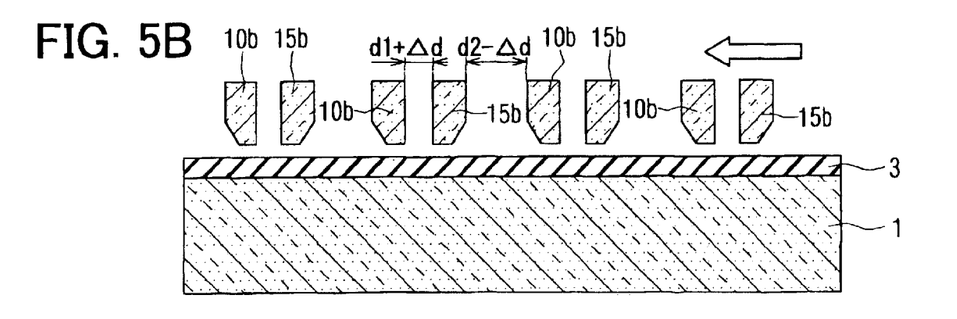
FIG. 5B is a partial schematic cross-sectional view of the sensor in FIG. 1A taken along the line VA—VA, showing the state that the sensor is accelerated.

For example, when the sensor is accelerated to displace the first movable electrodes 10a by $\Delta d$ in the direction shown by arrows in FIGS. 4B and 5B, the narrow gaps become (d1−$\Delta d$) and the wide gaps become (d2−$\Delta d$) in the first detection part 19 to increase the first capacitance CS1. On the other hand, the narrow gaps become (d1+$\Delta d$) and the wide gaps become (d2−$\Delta d$) in the second detection part 20 to decrease the second capacitance CS2. As a result, the capacitance difference $\Delta C$ increases.

From eq. 6, $\Delta C$ can be expressed by the following equation.

$$\Delta C=\in \times n \times L \times h1 \times [\{h1/(d1-\Delta d)+h2/(d2+\Delta d)\}-\{h1/(d1+\Delta d)+h2/(d2-\Delta d)\}]=\in \times n \times L \times h1 \times 2\Delta d \times \{h1/(d1^2-\Delta d^2)-h2/(d2^2-\Delta d^2)\}$$

Here, $\Delta d$ is sufficiently small in comparison with d1 and d2. Therefore, $\Delta C$ can be expressed by the following equation eq. 7.

$$\Delta C \approx \in \times n \times L \times h1 \times 2\Delta d \times (h1/d1^2-h2/d2^2) \qquad \text{eq. 7}$$

As understood by comparing eq. 5 with eq. 7, the sensor sensitivity can be increased by machining the electrodes 10a, 10b, 15a, 15b to satisfy the following equation eq. 8.

$$h1>h2 \qquad \text{eq. 8}$$

The electrodes 10a, 10b, 15a, 15b can be machined to satisfy the equation eq. 8, for example, by plasma etching. More specifically, the dimension d1 of the narrow gaps is set to generate a predetermined micro loading effect when the plasma etching is implemented. Due to the micro loading effect, the etching rate of the second semiconductor layer 2 is slower at the narrow gaps than at the wide gaps. Therefore, when the narrow gaps are completed by the etching, the second semiconductor layer 2 is overetched at the wide gaps to form notches on the sidewalls that define the wide gaps, as shown in FIG. 2C. As a result, the electrodes 10a, 10b, 15a, 15b can be machined to satisfy the equation eq. 8.

From the equations eq. 5 and eq. 7, the capacitance change rate $\Delta C/\Delta C0$ is expressed by the following equation eq. 9, $$\Delta C/\Delta C = (X - h2/h1)/(X-1) \qquad \text{eq. 9}$$

where $X = d2^2/d1^2$.

Figure 6:
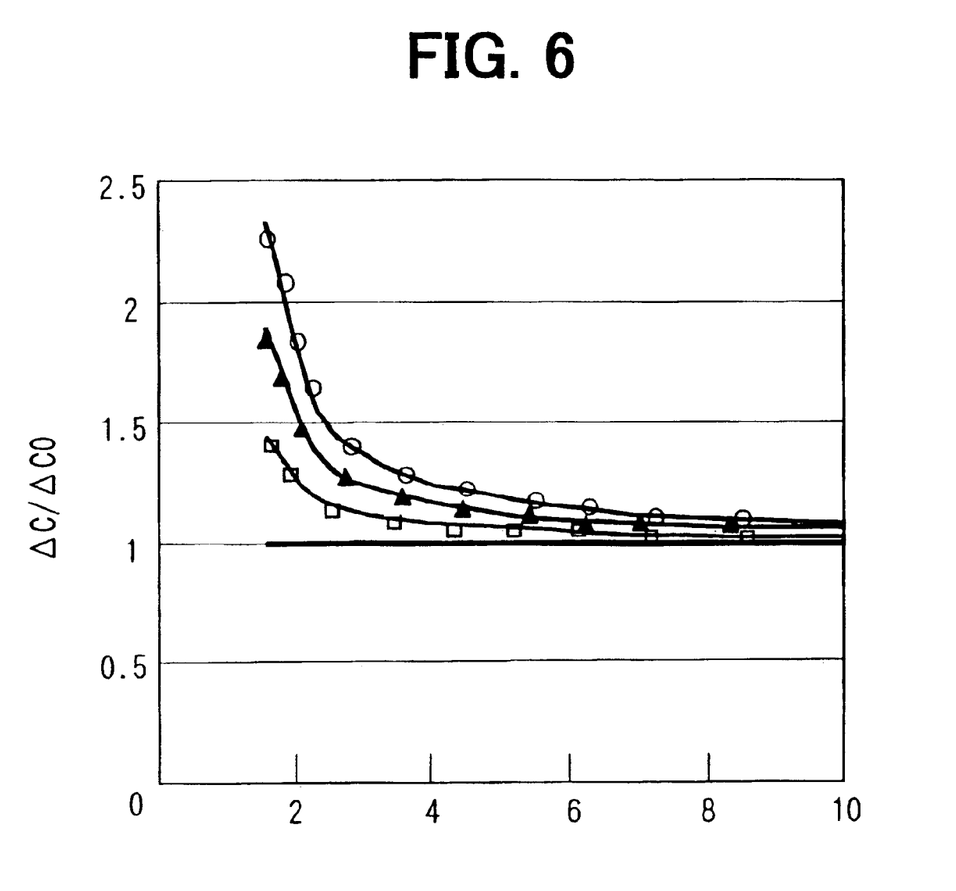
FIG. 6 is a graph that shows the correlation between the capacitance change rate $\Delta C/\Delta C0$ and $d2^2/d1^2$.

FIG. 6 is a graph that shows the correlation between the capacitance change rate $\Delta C/\Delta C0$ and $d2^2/d1^2$. In FIG. 6, symbols ○, ▲, and ☐ represent the correlation when h2/h1=0.25, the correlation when h2/h1=0.5, and the correlation when h2/h1=0.75, respectively. The solid line without any symbol represents the correlation when h2/h1=1.0, that is, when h2=h1. As understood from FIG. 6, the sensor sensitivity can be increased in comparison with the proposed sensor of FIG. 7A by making the electrode height h2 of the wide gap electrode surfaces smaller than the electrode height h1 of the narrow gap electrode surfaces to increase the capacitance change rate $\Delta C/\Delta C0$.

As described above, in the semiconductor acceleration sensor according to this embodiment, the electrode height h2 of the wide gap electrode surfaces is smaller than the electrode height h1 of the small gap electrode surfaces to increase the capacitance change rate $\Delta C/\Delta C0$. With the structure, the capacitance difference $\Delta C$ becomes greater than the capacitance difference $\Delta C0$ of the proposed sensor, so it is possible to increase the sensor sensitivity.

Other Embodiments

In the first embodiment, the sensor sensitivity is improved by reducing the electrode height h2 of the electrode surfaces that define the wide gaps. However, the sensor sensitivity may be improved by reducing the effective electrode length L of the electrode surfaces that define the wide gaps. Alternatively, the electrode height h2 and the effective electrode length L may be reduced at the same time.

In the first embodiment, all the electrode surfaces that define the wide gaps have the same electrode height h2. However, it is not necessary that all the electrode surfaces that define the wide gaps should have the same electrode height h2 as long as at least one electrode surface that defines one wide gap has the electrode height h2.

The semiconductor acceleration sensor of FIGS. 1A and 1B is manufactured by etching the second semiconductor layer 2 from the surface thereof. However, the present invention can be applied to a semiconductor sensor, the diaphragm such as a movable electrode of which is formed by etching the first semiconductor layer 1 of the sensor from its surface, or from its non-insulating-layer side.

What is claimed is:

1. A capacitive dynamic quantity sensor comprising:
    a semiconductor substrate;
    a weight, which is movably supported by the semiconductor substrate;
    a first movable electrode, which is integrated with the weight; and
    two first fixed electrodes, which are stationarily supported by the semiconductor substrate, wherein the first fixed electrodes face the first movable electrode to provide a first narrow gap and a first wide gap and form a first detection part having a first capacitance, wherein the weight and the first movable electrode are displaced relative to the first fixed electrodes in response to a dynamic quantity to be detected such that one of the gaps increases while the other decreases, wherein the dynamic quantity is detected on a basis of a variation in the first capacitance, and wherein one of wide gap electrode surfaces, which define the first wide gap, is smaller than narrow gap electrode surfaces, which define the first narrow gap, to improve sensor sensitivity.

2. The sensor according to claim 1, wherein an electrode height of one of the wide gap electrode surfaces is smaller than an electrode height of the narrow gap electrode surfaces.

3. The sensor according to claim 1, the sensor further comprising:
    a second movable electrode, which is integrated with the weight; and
    two second fixed electrodes, which are stationarily supported by the semiconductor substrate, wherein the second fixed electrodes face the second movable electrode to provide a second narrow gap and a second wide gap and form a second detection part having a second capacitance, wherein the weight and the second movable electrode are displaced relative to the second fixed electrodes in response to the dynamic quantity to be detected such that one of the second narrow gap and the second wide gap increases while the other decreases and such that one of the first and second narrow gaps increases while the other decreases, and wherein the dynamic quantity is detected on a basis of the variation in the first capacitance and a variation in the second capacitance.

4. A detector comprising a capacitive dynamic quantity sensor, wherein the sensor includes:
    a semiconductor substrate;
    a weight, which is movably supported by the semiconductor substrate;
    a first movable electrode, which is integrated with the weight;
    two first fixed electrodes, which are stationarily supported by the semiconductor substrate, wherein the first fixed electrodes face the first movable electrode to provide a first narrow gap and a first wide gap and form a first detection part having a first capacitance, wherein the weight and the first movable electrode are displaced relative to the first fixed electrodes in response to a dynamic quantity to be detected such that one of the gaps increases while the other decreases, and wherein one of wide gap electrode surfaces, which define the first wide gap, is smaller than narrow gap electrode surfaces, which define the first narrow gap, to improve sensor sensitivity;
    a second movable electrode, which is integrated with the weight;
    two second fixed electrodes, which are stationarily supported by the semiconductor substrate, wherein the second fixed electrodes face the second movable electrode to provide a second narrow gap and a second wide gap and form a second detection part having a second capacitance, and wherein the weight and the second movable electrode are displaced relative to the second fixed electrodes in response to the dynamic quantity to be detected such that one of the second narrow gap and the second wide gap increases while the other decreases and such that one of the first and second narrow gaps increases while the other decreases; and
    a detection circuit, which outputs a detection signal in response to a capacitance difference between the first and second capacitances when the first and second capacitances vary due to the dynamic quantity to be detected.

5. A method for manufacturing a capacitive dynamic quantity sensor that includes:
    a semiconductor substrate;

a weight, which is movably supported by the semiconductor substrate;

a movable electrode, which is integrated with the weight; and two fixed electrodes, which are stationarily supported by the semiconductor substrate, wherein the fixed electrodes face the movable electrode to provide a narrow gap and a wide gap and form a detection part having a capacitance, wherein the weight and the movable electrode are displaced relative to the fixed electrodes in response to a dynamic quantity to be detected such that one of the gaps increases while the other decreases, and wherein the dynamic quantity is detected on a basis of a variation in the capacitance, the method comprising:

forming the movable electrode and the two fixed electrodes on the semiconductor substrate such that one of wide gap electrode surfaces, which define the wide gap, becomes smaller than narrow gap electrode surfaces, which define the narrow gap, to improve sensor sensitivity.

6. The method according to claim 5, wherein the movable electrode and the two fixed electrodes are formed such that an electrode height of one of the wide gap electrode surfaces is smaller than an electrode height of the narrow gap electrode surfaces.

* * * * *